(12) United States Patent
Shanivarasanthe Nithyananda Kumar et al.

(10) Patent No.: US 11,819,864 B2
(45) Date of Patent: Nov. 21, 2023

(54) METHOD AND AN APPARATUS FOR APPLYING THIN FILM MATERIAL ONTO A SUBSTRATE

(71) Applicants: IMEC VZW, Leuven (BE); UNIVERSITEIT HASSELT, Hasselt (BE)

(72) Inventors: Rachith Shanivarasanthe Nithyananda Kumar, Hasselt (BE); Wim Deferme, Hechtel (BE)

(73) Assignees: IMEC VZW, Leuven (BE); UNIVERSITEIT HASSELT, Hasselt (BE)

( * ) Notice: Subject to any disclaimer, the term of this patent is extended or adjusted under 35 U.S.C. 154(b) by 0 days.

(21) Appl. No.: 17/988,874

(22) Filed: Nov. 17, 2022

(65) Prior Publication Data

US 2023/0149965 A1    May 18, 2023

(30) Foreign Application Priority Data

Nov. 18, 2021 (EP) .................................... 21209014

(51) Int. Cl.
*B05B 17/06* (2006.01)
*B05D 1/02* (2006.01)

(52) U.S. Cl.
CPC ............... *B05B 17/06* (2013.01); *B05D 1/02* (2013.01)

(58) Field of Classification Search
CPC ... B05D 1/00; B05D 1/02; B05D 1/26; B05D 1/28; B05D 1/42
See application file for complete search history.

(56) References Cited

U.S. PATENT DOCUMENTS

| 2019/0214604 A1 | 7/2019 | Zhen et al. |
| 2021/0178420 A1* | 6/2021 | Naito ....................... B05D 1/28 |

FOREIGN PATENT DOCUMENTS

| CN | 111841986 | | 10/2020 |
| DE | 10 2017 003718 | | 10/2018 |
| EP | 2 688 118 | | 1/2014 |
| KR | 101442672 | * | 4/2013 |
| KR | 101442672 | | 9/2014 |

(Continued)

OTHER PUBLICATIONS

Zheng et al., "Spray-coated nanoscale conductive patterns based on in situ sintered silver nanoparticle inks" (2014) (Year: 2014).*

(Continued)

*Primary Examiner* — Nathan T Leong
(74) *Attorney, Agent, or Firm* — MOSER TABOADA

(57) ABSTRACT

A method for applying thin film material onto a substrate comprises: forming microdroplets of a solvent and a solute material forming the thin film material; depositing the microdroplets on an upper surface of a micro-structured mesh, wherein the microdroplets are deposited to allow coalescing into droplets extending into the micro-structured mesh; and arranging a surface of the substrate in close relation to a bottom surface of the micro-structured mesh such that a capillary force draws liquid of the droplets onto the surface of the substrate, whereby forced dynamic wetting of the surface of the substrate is provided to form a liquid film on the surface of the substrate.

13 Claims, 7 Drawing Sheets

(56) References Cited

FOREIGN PATENT DOCUMENTS

KR             102277314          7/2021

OTHER PUBLICATIONS

Zheng et al, "Spray-coated nanoscale conductive patterns based on in situ sintered silver nanoparticle inks", Nanoscale Research Letters, vol. 9, No. 145, pp. 1-7, 2014.
Reale et al, "Spray Coating for Polymer Solar Cells: An Up-to-Date Overview", Energy Technology, vol. 3, issue 4, pp. 385-406, 2015.
Steirer et al: "Ultrasonically sprayed and inkjet printed thin film electrodes for organic solar cells", Thin Solid Films, vol. 517, No. 8, pp. 2781-2786, 2009.
Steirer et al: "Ultrasonic spray deposition for production of organic solar cells", Solar Energy Materials and Solar Cells, vol. 93, No. 4, pp. 447-453, 2009.
Extended European Search Report in EP21209014.6 dated May 20, 2022.

* cited by examiner

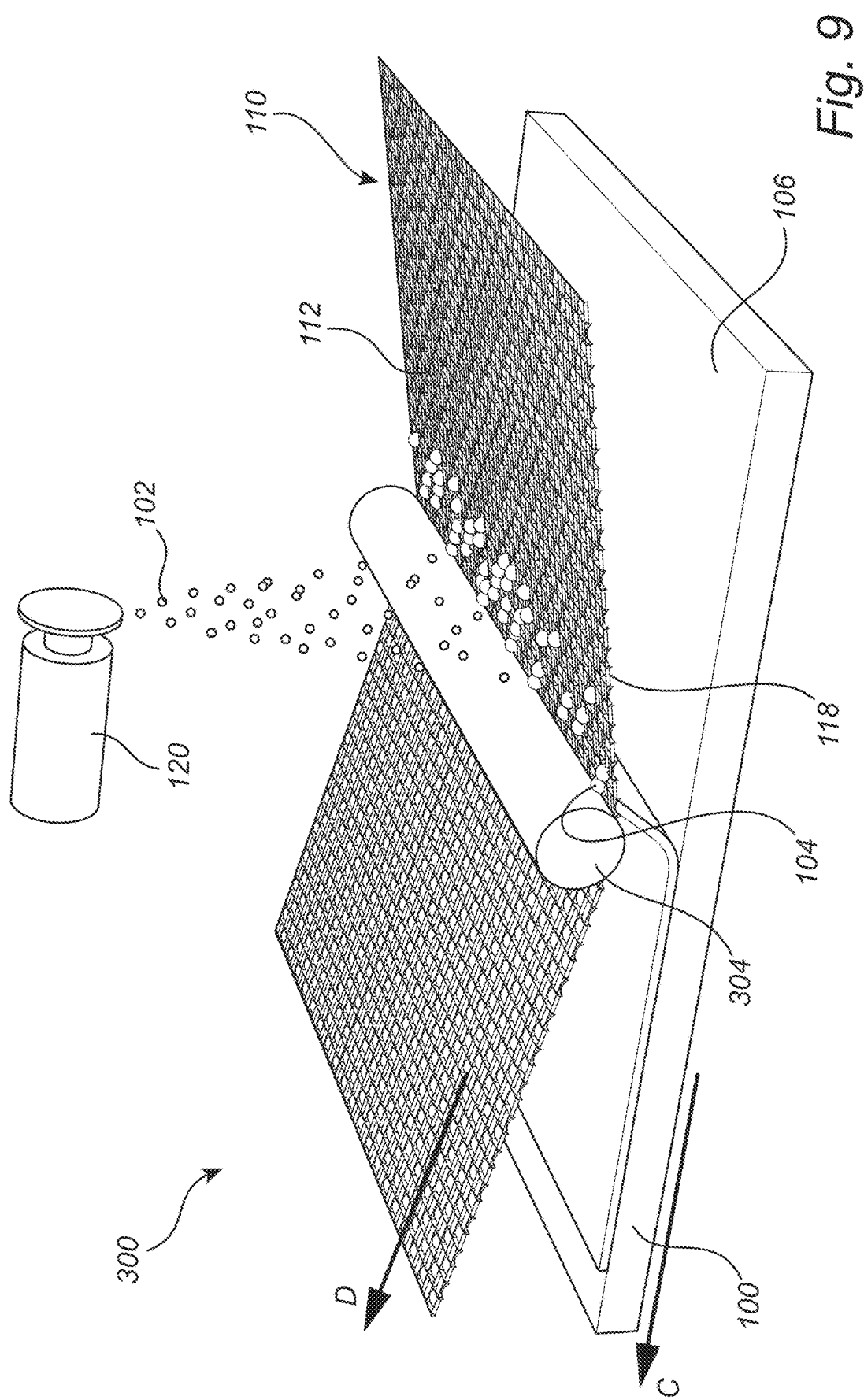

METHOD AND AN APPARATUS FOR APPLYING THIN FILM MATERIAL ONTO A SUBSTRATE

CROSS-REFERENCE TO RELATED APPLICATIONS

The present application claims the benefit of and priority to EP Patent Application Serial No. 21209014.6, filed Nov. 18, 2021, the entire contents of which is incorporated herein by reference.

TECHNICAL FIELD

The present inventive concept relates to a method and an apparatus for applying thin film material onto a substrate, whereby a thin film may be formed.

BACKGROUND

Thin films are being increasingly used in various application fields. In particular, there is an interest in ultra-thin films having a thickness in a nanometer scale, such as films being thinner than 100 nm. However, for thinner films, it is increasingly difficult to produce films having a homogeneous thickness.

Material for forming thin films may be deposited on a surface using deposition of small droplets in which the material to be deposited on the surface is dissolved. A solvent is allowed to evaporate to leave the deposited material on the surface. However, rate of evaporation may be higher at edges of a droplet such that a hydrodynamic fluid flow may be initiated within the droplet. Thus, a solute in the droplets are carried by the fluid flow such that irregular ring-like structures know as coffee rings are formed in the deposited thin film.

Thus, there is a need for an improved technique for applying thin film material onto substrates for enabling thin films with homogeneous thickness to be formed.

SUMMARY

An objective of the present inventive concept is to enable forming of thin films having homogeneous thickness.

This and other objectives of the present inventive concept are at least partly met by the invention as defined in the independent claims. Preferred embodiments are set out in the dependent claims.

According to a first aspect, there is provided a method for applying thin film material onto a substrate, said method comprising: forming microdroplets of a solvent and a solute material forming the thin film material; depositing the microdroplets on an upper surface of a micro-structured mesh, wherein the microdroplets are deposited to allow coalescing of microdroplets on the micro-structured mesh into droplets extending at least into the micro-structured mesh and possibly protruding from a bottom surface of the micro-structured mesh; and arranging a surface of the substrate in close relation to the bottom surface of the micro-structured mesh such that a capillary force draws liquid of the droplets extending at least into the micro-structured mesh and possibly protruding from the bottom surface of the micro-structured mesh onto the surface of the substrate, whereby forced dynamic wetting of the surface of the substrate is provided to form a liquid film on the surface of the substrate.

Thanks to the present inventive concept, droplets are deposited on a mesh and then allowed to coalesce to form larger droplets on the mesh. Then, the mesh is used for transferring the liquid to the surface of a substrate on which a thin film is to be formed. The solute material is arranged in the liquid film such that the thin film material is applied onto the surface of the substrate when the liquid film is formed. Thanks to using the mesh for transferring the liquid to the surface, a forced dynamic wetting of the surface can take place instead of separate droplets being formed on the surface. This implies that a uniform layer (having uniform thickness) of the liquid from the droplets can be formed on the surface. Having a uniform layer of the liquid on the surface, evaporation of the solvent may occur with a constant evaporative flux profile over the surface, such that a uniform thin film of the solute material can be formed on the surface of the substrate.

Thanks to the present inventive concept, the liquid film is formed on the surface of the substrate by being transferred by capillary force from the mesh to the surface. Microdroplets are not formed on the surface of the substrate, but rather a uniform thin film can be directly formed. It is realized that once a microdroplet is deposited on a substrate, it is very difficult to manipulate wetting behavior of the microdroplet. Hence, thanks to avoiding the liquid film to be formed through deposition of microdroplets on the surface, the wetting behavior of microdroplets on the surface is avoided.

There is no restriction on an area being used for depositing the microdroplets on the micro-structured mesh or for forced dynamic wetting of the surface of the substrate. Thus, the method can be used for applying a liquid film such that forming a uniform thin layer of the solute material may be achieved over a large area of the surface.

The applying of the thin film material onto the substrate does not involve vacuum deposition (as is often used in alternative methods for fabrication of thin films). Thus, the method provides a cost-efficient approach for applying thin film material onto the substrate. Further, the method consumes little power, which may be beneficial in ensuring that fabrication of thin films is carbon neutral.

The applying of the thin film material onto the substrate does not require any pre-treatment or post-treatment of the substrate. This implies that temperature-sensitive substrates, i.e. substrates formed by temperature-sensitive materials or carrying structures that are temperature-sensitive, may be used. Thus, the thin film material is applied without requiring the substrate to be exposed to an elevated temperature that could harm a temperature-sensitive substrate.

It should be realized that the micro-structured mesh is not used for transferring a pattern defined by the mesh onto the surface of the substrate. Rather, the mesh is used for capturing droplets, which may then be transferred onto the surface of the substrate for forming a uniform liquid film. The micro-structured mesh allows small droplets to be captured and formed on the mesh and also allows transfer of liquid onto the surface of the substrate throughout a large area of the mesh.

The microdroplets refer to droplets that are deposited on a micro-structured mesh, i.e. before the droplets reach the mesh. The microdroplets may have a size that is adapted to dimensions of features of the micro-structured mesh in order for a suitable formation of droplets on the micro-structured mesh. It should be realized that microdroplets have a size in microscopic scale, i.e. smaller than what can be seen by a naked eye. Thus, the microdroplets may have a size, i.e. diameter, in a range of a few µm to hundreds of µm, such as microdroplets being smaller than 500 µm, such as smaller than 200 μm. It should further be realized that the forming of microdroplets does not necessarily generate microdroplets that are all equally sized. Rather, there may be a distribution of sizes in the formed microdroplets. When discussing sizes of microdroplets below, an average size of the microdroplets is referred unless stated otherwise.

The micro-structured mesh refers to a mesh having dimensions in microscopic scale, i.e. smaller than what can be seen by a naked eye. The mesh may comprise threads arranged in a pattern for forming spacings between adjacent threads. Thus, a size of individual spacings in the mesh and a diameter of individual threads are features of the micro-structured mesh that have dimensions in the microscopic scale.

The micro-structured mesh may have dimensions that are adapted for capturing microdroplets impinging on the micro-structured mesh and also adapted for transferring the liquid of the droplets to the surface of the substrate for forming the uniform liquid film. Thus, size of the microdroplets and the dimensions of the micro-structured mesh may need to be related to each other.

Typically, the spacings of the micro-structured mesh should not be much larger than the size of the microdroplets in order to avoid that a large proportion of the microdroplets pass through the mesh unaffected. However, it should be realized that once microdroplets are deposited on the upper surface of the micro-structured mesh, the microdroplets formed on the micro-structured mesh will aid in capturing subsequent microdroplets impinging on the upper surface of the micro-structured mesh so as to prevent the microdroplets from passing through the spacings of the mesh. Thus, the spacings of the micro-structured mesh need not necessarily be smaller than the size of the microdroplets.

The threads of the micro-structured mesh may be arranged in two sets of parallel lines, wherein the sets are perpendicular to each other, such that square or rectangular spacings may be formed. A size of a spacing may be defined by a largest side of the spacing. The spacings may have a size in a range of a few μm to hundreds of μm or even as large as a few millimeters, such as spacings being smaller than 500 μm, such as smaller than 200 μm.

The threads may have a similar size (diameter or other cross-sectional size for non-circular cross-sections) to the spacings, such that a relatively large proportion of an area of the micro-structured mesh is defined by the threads. Thus, the threads may have a size in a range of a few μm to hundreds of μm, such as threads being smaller than 500 μm, such as smaller than 200 μm.

The depositing of the microdroplets on the upper surface of the micro-structured mesh may involve a flux of microdroplets being incident on the micro-structured mesh. For instance, microdroplets may be formed and deposited on the micro-structured mesh through spraying of microdroplets on the micro-structured mesh. Once microdroplets are deposited, the microdroplets may coalesce with further microdroplets being deposited on the micro-structured mesh so as to form larger droplets on the micro-structured mesh than are initially deposited on the micro-structured mesh. The microdroplets may form milli-droplets, i.e. droplets in a millimeter scale, on the micro-structured mesh. For instance, the droplets may coalesce towards droplets having a size (diameter and thickness) corresponding to a capillary length of the liquid of the droplets. These droplets may extend over a plurality of threads of the micro-structured mesh and may form a droop extending into the spacings allowing for the liquid to be further transferred to the surface of the substrate when the surface of the substrate is close to the bottom surface of the micro-structured mesh.

Formation and profile of the droplets on the upper surface of the micro-structured mesh may depend on spreading coefficient and a geometry of texture of the micro-structured mesh. Partial wetting of the upper surface of the micro-structured mesh may occur, which may imply that droplets are formed on the upper surface of the micro-structured mesh with a droop extending into spacings of the micro-structured mesh from the upper surface of the micro-structured mesh but not necessarily protruding from the micro-structured mesh (i.e. an extension of the droplet into the spacing is smaller than a diameter of the thread that may define a distance between the upper surface of the micro-structured mesh and the bottom surface of the micro-structured mesh). However, in partial wetting of the micro-structured mesh, the droplets may extend into the spacing to protrude from the bottom surface of the micro-structured mesh. If full wetting of the micro-structured mesh occurs, the droplets may coalesce to form droplets having a top half extending on an upper side of the micro-structured mesh and a bottom half extending on a lower side of the micro-structured mesh such that the droplets protrude from the bottom surface of the micro-structured mesh.

The method comprises arranging a surface of the substrate so close to the bottom surface of the micro-structured mesh such that liquid of the droplets is affected by a capillary force for wetting of the surface of the substrate. This may imply that the surface of the substrate is arranged closer to the droplets than a capillary length of the droplets. At such distance, a capillary force may be sufficient to draw the liquid of the droplets from the micro-structured mesh onto the surface of the substrate. However, it should be realized that a sufficient capillary force may still be present, even if the surface of the substrate is arranged farther away from the bottom surface of the micro-structured mesh (and from the droplets) than the capillary length. Thus, the arranging of the surface of the substrate in close relation to the bottom surface of the micro-structured mesh may imply that the surface of the substrate is arranged within a few mm, such as closer than 10 mm from the bottom surface of the micro-structured mesh. However, according to embodiments, the surface of the substrate is arranged closer than 1 mm or closer than 200 μm from the bottom surface of the micro-structured mesh. In fact, the surface of the substrate may even be arranged in contact with the bottom surface of the micro-structured mesh. However, if the surface of the substrate is arranged in contact with the bottom surface of the micro-structured mesh, the micro-structured mesh may need to be very clean so as to avoid that any particles are transferred from the mesh to the surface of the substrate.

For instance, if droplets protrude from the bottom surface of the micro-structured mesh, the surface of the substrate may even be arranged to touch the droplets. The capillary force may then further act to spread the liquid onto the surface of the substrate. However, it is not necessary for the substrate to be arranged so close to the micro-structured mesh that the surface of the substrate initially touches the droplets. Rather, the capillary force may act to draw the liquid from the droplets towards the surface of the substrate and to further spread the liquid onto the surface of the substrate.

Also, even if the droplets do not initially protrude from the bottom surface of the micro-structured mesh, a force may be applied on the micro-structured mesh so as to deform the micro-structured mesh at a location in which droplets have been formed, which may cause the spacings of the micro-structured mesh to increase in size such that the droplets may then protrude from the bottom surface of the micro-structured mesh. This may be used when the micro-structured mesh is flexible so as to allow deformation of the micro-structured mesh. Thus, the surface of the substrate may be arranged to touch the droplets, thanks to deformation of the micro-structured mesh allowing the droplets to protrude further from the bottom surface of the micro-structured mesh. However, it is still not necessary for the substrate to be arranged so close to the micro-structured mesh that the surface of the substrate initially touches the droplets, even if the micro-structured mesh is deformed to allow the droplets to further protrude from the bottom surface of the mesh. Rather, the capillary force may act to draw the liquid from the droplets towards the surface of the substrate and to further spread the liquid onto the surface of the substrate.

Arranging the surface of the substrate in close relation to the bottom surface of the substrate may involve acting on the substrate to move the surface of the substrate towards the micro-structured mesh, acting on the micro-structured mesh to move the micro-structured mesh towards the surface of the substrate, or both. This may imply moving the entire substrate and/or the entire mesh or moving a part of the substrate and/or the mesh. For instance, the substrate may be formed by a roll, which may be transported past a wetting position at which the surface is wetted. At the wetting position, the roll may be manipulated to follow a path bringing the roll close to the micro-structured mesh so as to arrange the surface of the substrate in close relation to the bottom surface of the micro-structured mesh.

The surface of the substrate may be arranged in close relation to the bottom surface of the substrate after the microdroplets have been deposited and allowed to coalesce to form larger droplets. This implies that wetting of the surface of the substrate will only take place after a plurality of droplets have been formed on the micro-structured mesh so that wetting may occur simultaneously from a plurality of microdroplets, which may facilitate forming of a uniform liquid film on the surface of the substrate.

Forced dynamic wetting implies that an external force is provided to influence flow of liquid so as to wet the surface of the substrate. This is in contrast to spontaneous wetting, where only capillary force drives the flow of liquid. The forced dynamic wetting may be provided thanks to the presence of the micro-structured mesh close to the surface of the substrate.

When the surface of the substrate is arranged close to the bottom surface of the micro-structured mesh, a plurality of individual droplets will simultaneously try to wet the surface. The plurality of droplets could form a liquid film with an abrupt increase in thickness when the droplets interfere constructively on the surface. However, thanks to the presence of the mesh formation of abrupt increases in thickness may be prevented, due to an applied force by the micro-structured mesh over the liquid film resembling a force exerted by nano-hairs of water striders on a liquid. The applied force may cause hydrostatic pressure inside the liquid to increase, which may then force liquid to flow in lateral dimensions so as to spread over the surface of the substrate.

According to an embodiment, the method further comprises, after the liquid film has been formed on the surface of the substrate, separating the micro-structured mesh from the substrate.

Thus, the substrate and the micro-structured mesh may be moved in relation to each other after the liquid film has been formed leaving the liquid film on the surface of the substrate without the liquid film being in contact with the micro-structured mesh.

Separating the micro-structured mesh from the surface of the substrate may involve acting on the substrate to move the surface of the substrate away from the micro-structured mesh, acting on the micro-structured mesh to move the micro-structured mesh away from the surface of the substrate, or both. This may imply moving the entire substrate and/or the entire mesh or moving a part of the substrate and/or the mesh. For instance, the substrate may be formed by a roll, which may be transported past a wetting position at which the surface is wetted. After passing the wetting position, the roll may be manipulated to follow a path separating the roll from the micro-structured mesh.

According to an embodiment, the method further comprises, after the liquid film has been formed on the surface of the substrate, allowing the solvent to evaporate to leave the solute material on the surface of the substrate for forming a thin film on the substrate.

A time required for evaporating the solvent is dependent on an evaporation rate of the solvent. The solvent may evaporate spontaneously, by e.g. being exposed to room temperature. Thus, the solvent may be allowed to evaporate spontaneously based on an ambient temperature during producing of the thin film on the substrate.

However, it should be realized that solvent may be allowed to evaporate based on an active step of causing evaporation. For instance, the surface of the substrate may be exposed to an increased temperature for causing the solvent to evaporate, such as using a mild increase in temperature. The temperature used may depend on the solvent. As an example, the temperature may be below 60° C. when water is used as the solvent. Even if the solvent has a high evaporation rate and may be relatively quickly evaporated through spontaneous evaporation, it may still be advantageous to apply an increase temperature for controlling evaporation and for reducing time for formation of the thin film on the substrate.

A time required for forming of droplets on the micro-structured mesh and transferring the droplets to the surface of the substrate may be substantially shorter than a time required for evaporation of the solvent, such that the solvent will not be evaporated before the liquid film has been formed on the surface of the substrate.

The solute material may be homogeneously distributed in the solvent. Thus, when the solvent is evaporated, the solute material is left on the surface of the substrate to form the thin film on the substrate. Evaporation of the solvent may occur with a constant evaporative flux profile over the surface, such that a uniform thin film of the solute material can be formed on the surface of the substrate.

Evaporation of solvent may occur such that the solvent leaves the substrate through the micro-structured mesh. This may further ensure that a constant evaporative flux profile is provided over the surface.

According to an embodiment, the thin film being formed on the substrate has a thickness smaller than 50 nm, such as smaller than 15 nm.

Thus, a very thin film with a uniform thickness may be formed on a large area of the surface of the substrate. It should be realized that the desired thickness of the thin film may depend on an application in which the thin film is to be formed. The method may very well be used for forming films of the solute material with a greater thickness than 50 nm, such as thin films having a thickness up to 100 nm or a thickness up to 1 µm. However, forming of large-size, uniform thin films of a very small thickness using technology that may be used in mass production is particularly difficult and for such reason it is particularly interesting to use the method for forming a thin film having a thickness smaller than 50 nm, such as smaller than 15 nm.

According to an embodiment, the method further comprises controlling a concentration of the solute material in the microdroplets being formed such that a thickness of the thin film being formed on the substrate is controlled.

The thickness of the thin film being formed may at least be dependent on the thickness of the liquid film being formed on the surface of the substrate and on the concentration of the solute material. Any of these parameters may be controlled for controlling the thickness of the thin film. The thickness of the liquid film may e.g. depend on an amount of microdroplets being deposited on the micro-structured mesh (which may in turn depend on flow rate of the deposited microdroplets and deposition time), and parameters relating to transfer of droplets from the micro-structured mesh to the surface of the substrate.

The controlling of the concentration of the solute material has a direct relation to the thickness of the thin film being formed on the substrate. Thus, the thickness of the thin film may be simply controlled by controlling the concentration of the solute material.

According to an embodiment, the microdroplets are deposited to allow coalescing of microdroplets on the micro-structured mesh into droplets protruding from the bottom surface of the micro-structured mesh and wherein arranging the surface of the substrate in close relation to the bottom surface of the micro-structured mesh comprises bringing the substrate in contact with the droplets protruding from the bottom surface of the micro-structured mesh.

By ensuring that the droplets are formed so as to protrude from the bottom surface of the micro-structured mesh, the surface of the substrate can easily be brought in close relation to the droplets so that the capillary force draws liquid of the droplets onto the surface of the substrate. Thus, there is no need to arrange the surface of the substrate in contact with the micro-structured mesh for drawing the liquid onto the surface of the substrate and thereby need of having a very clean mesh is avoided. Further, the surface of the substrate may be brought into contact with the droplets such that a strong capillary force may act on the liquid of the droplets for ensuring proper wetting of the surface of the substrate.

The microdroplets may be allowed to coalesce to droplets protruding from the bottom surface of the micro-structured mesh before the surface of the substrate is brought into contact with the droplets. Thus, wetting of the surface of the substrate is not initiated in some places (due to the droplets touching the surface) while droplets are still coalescing in other places. Such wetting could otherwise lead to non-uniform deposition of the surface of the substrate.

The droplets formed by coalescing of microdroplets may have different shapes depending e.g. on surface tension of the solvent and surface energy of the micro-structured mesh. If partial wetting of the micro-structured mesh occurs, droplets may be formed according to Cassie-Baxter model forming an air pocket between the mesh and the droplet at a center of the droplet. At edges of the droplet, the droplet may extend into the micro-structured mesh, and protrusion of the droplet into the micro-structured mesh may depend on thickness of threads of the micro-structured mesh and on a distance between adjacent threads. For such droplets, the droplets will typically not protrude from the bottom surface of the micro-structured mesh. If complete wetting of the micro-structured mesh occurs, droplets may be formed according to Wenzel model penetrating the micro-structured mesh to extend on both sides of the micro-structured mesh.

Dimensions and material used for the micro-structured mesh as well as material used for the solvent may be selected for controlling a type of droplets being formed when microdroplets coalesce. This may be used for allowing coalescing of microdroplets on the micro-structured mesh into droplets protruding from the bottom surface of the micro-structured mesh.

According to an embodiment, the micro-structured mesh is formed by interlaced threads defining spacings between the threads.

This is a suitable manner of forming the micro-structured mesh providing a structure of the mesh that is suitable for depositing of microdroplets that coalesce into droplets.

According to an embodiment, a distance between adjacent threads in the micro-structured mesh is smaller than five times a diameter of the formed microdroplets.

Thus, the micro-structured mesh used may be dimensioned in relation to the size of the microdroplets that will be formed. Similarly, the forming of the microdroplets may be controlled such that the size of the formed microdroplets is adapted to the dimensions of the micro-structured mesh. In this regard, it should be understood that there may be a distribution in the size of the formed droplets and that the distance between adjacent threads is related to an average diameter of the formed droplets.

Having a micro-structured mesh with spacings (distance between adjacent threads) being smaller than five times the diameter of the droplets may ensure that the microdroplets are deposited on the micro-structured mesh. Even if some microdroplets may initially pass through the spacings, droplets will quickly form on the micro-structured mesh to fill the spacings and thereby start to prevent microdroplets from passing through the micro-structured mesh. Hence, the spacings of the micro-structured mesh may be larger than the microdroplets without a large portion of the microdroplets passing through the micro-structured mesh. Having relatively large spacings may also be advantageous for allowing the liquid of the droplets to be drawn onto the surface of the substrate.

According to another embodiment, the distance between adjacent threads in the micro-structured mesh is smaller than three times the diameter of the formed microdroplets, such as equal to the diameter of the formed microdroplets. This may ensure that the very few microdroplets pass through the micro-structured mesh during depositing of the microdroplets on the micro-structured mesh.

The distance between adjacent threads may thus advantageously be related to the size of the formed microdroplets. According to an embodiment, the distance between adjacent threads may be smaller than 200 µm, such as smaller than 100 µm.

A size of a cross-section of the threads, such as a diameter of the threads for circular cross-sections may be similar to the distance between adjacent threads. According to an embodiment, the size of the cross-section of the threads may be smaller than 200 µm, such as smaller than 100 µm. The size of the threads also functions to facilitate forced dynamic wetting using threads that are sufficiently small so as not to break a surface of the liquid when a liquid film is formed on the surface of the substrate. Thus, in order to facilitate forced dynamic wetting, the size of the threads should not be too large. On the other hand, in order to ensure that the microdroplets are properly deposited on the upper surface of the micro-structured mesh, the size of the threads should not be too small.

According to an embodiment, the micro-structured mesh comprises a regular mesh pattern.

This may ensure that droplets having a spherical symmetry may be formed, which may ensure a good control of wetting of the surface of the substrate. Further, this may ensure that the surface of the substrate is wetted in a similar manner over an entire area of the surface.

According to an embodiment, a diameter (an average diameter) of the microdroplets is at least a factor 10 times smaller than a capillary length of the solvent.

Droplet size may affect wetting of the micro-structured mesh. Using small microdroplets allow the microdroplets to be deposited on the micro-structured mesh and also allows the microdroplets to coalesce into larger droplets that are appropriate for drawing liquid form the droplets to the surface of the substrate.

The diameter of the microdroplets may further be related to the dimensions of the micro-structured mesh, as discussed above. Thus, the diameter of the microdroplets may be larger than a fifth of the distance between adjacent threads of the micro-structured mesh.

According to an embodiment, the diameter of the microdroplets may be smaller than 200 μm, such as smaller than 100 μm.

According to an embodiment, arranging the surface of the substrate in close relation to the bottom surface of the micro-structured mesh comprises exerting a force on the micro-structured mesh for bringing the micro-structured mesh in close relation to the surface of the substrate.

This implies that the micro-structured mesh may be lowered towards the surface of the substrate when the liquid of the droplets of the micro-structured mesh is to be drawn onto the surface of the substrate. This may be a simple manner of bringing the micro-structured mesh in close relation to the surface of the substrate. For instance, the micro-structured mesh may be arranged in a frame, such that the entire frame may be lowered in order to bring the micro-structured mesh in close relation to the surface of the substrate.

According to an embodiment, the micro-structured mesh is flexible for bringing a portion of the micro-structured mesh in close relation to the surface of the substrate.

This implies that the micro-structured mesh may be deformed by exerting a force on the micro-structured mesh. A force may be exerted on the upper surface of the micro-structured mesh for pushing the portion of the micro-structured mesh towards a surface of the substrate, such that the portion of the micro-structured mesh is brought in close relation to the surface of the substrate.

When deforming the micro-structured mesh, adjacent threads in the portion of the micro-structured mesh may be pulled apart in order to allow the micro-structured mesh to deform. This implies that spacings in the micro-structured mesh may be enlarged so as to allow droplets to extend further into the micro-structured mesh from the upper surface or protrude further from the bottom surface of the micro-structured mesh. Hence, while the micro-structured mesh is brought in close relation to the surface of the substrate, the droplets are also pushed towards the surface of the substrate so as to promote liquid of the droplets being drawn by the capillary force to wet the surface of the substrate.

According to an embodiment, forming and depositing of microdroplets is made using ultrasonic spray coating.

Ultrasonic spray coating provides a technique for forming and depositing microdroplets with high accuracy, good resolution, and very high transfer rate. Thus, ultrasonic spray coating is suitable for forming and depositing of microdroplets.

Having a high transfer rate implies that material waste is very low, such that the use of ultrasonic spray coating may be environment-friendly.

According to a second aspect, there is provided an apparatus for applying thin film material onto a substrate, said apparatus comprising: a microdroplet generator for generating microdroplets of a solvent and a solute material forming the thin film material; a micro-structured mesh being arranged in relation to the microdroplet generator so as to receive microdroplets on an upper surface of the micro-structured mesh, wherein the micro-structured mesh is configured to promote microdroplets on the upper surface of the micro-structured mesh to coalesce into droplets extending at least into the micro-structured mesh and possibly protruding from a bottom surface of the micro-structured mesh; and a controller for controlling a relation of the substrate to the bottom surface of the micro-structured mesh such that a capillary force is formed to draw liquid of the droplets extending at least into the micro-structured mesh and possibly protruding from the bottom surface of the micro-structured mesh onto the surface of the substrate, whereby the controller is configured to control the relation of the substrate to the bottom surface of the micro-structured mesh such that forced dynamic wetting of the surface of the substrate is provided to form a liquid film on the surface of the substrate.

Effects and features of this second aspect are largely analogous to those described above in connection with the first aspect. Embodiments mentioned in relation to the first aspect are largely compatible with the second aspect.

The apparatus enables applying thin film material onto a substrate in a well-controlled manner such that forming of a thin film having a uniform thickness on the surface of the substrate is facilitated.

As used herein, the terms "upper surface" and "bottom surface" of the micro-structured mesh should be construed as defining two opposite surfaces of the mesh. In use of the apparatus, the micro-structured mesh may be arranged in the apparatus such that the micro-structured mesh is arranged in relation to a gravity field with the gravity field acting from the upper surface towards the bottom surface.

The controller may be configured to control actuator(s) to act on the substrate to move the surface of the substrate towards the micro-structured mesh, act on the micro-structured mesh to move the micro-structured mesh towards the surface of the substrate, or both.

The apparatus may further comprise a heater, configured to provide thermal energy to the liquid film for promoting evaporation of the solvent after the liquid film has been formed on the surface of the substrate.

The heater may provide control of evaporation and may also reduce time for formation of the thin film on the substrate.

BRIEF DESCRIPTION OF THE DRAWINGS

The above, as well as additional objects, features, and advantages of the present inventive concept, will be better understood through the following illustrative and non-limiting detailed description, with reference to the appended drawings. In the drawings like reference numerals will be used for like elements unless stated otherwise.

FIG. 1 is a schematic view illustrating forming of microdroplets and depositing the microdroplets on a micro-structured mesh according to an embodiment.

FIGS. 2a-b are schematic views of a micro-structured mesh according to an embodiment.

FIGS. 3a-c are schematic views illustrating partial wetting of the micro-structured mesh.

FIGS. 4a-c are schematic views illustrating complete wetting of the micro-structured mesh.

FIG. 9 is a schematic view of an apparatus according to an embodiment.

DETAILED DESCRIPTION

Referring now to FIGS. 1-7, a method for applying thin film material onto a substrate 100 for forming a thin film on the substrate 100 will be described.

Figure 1:
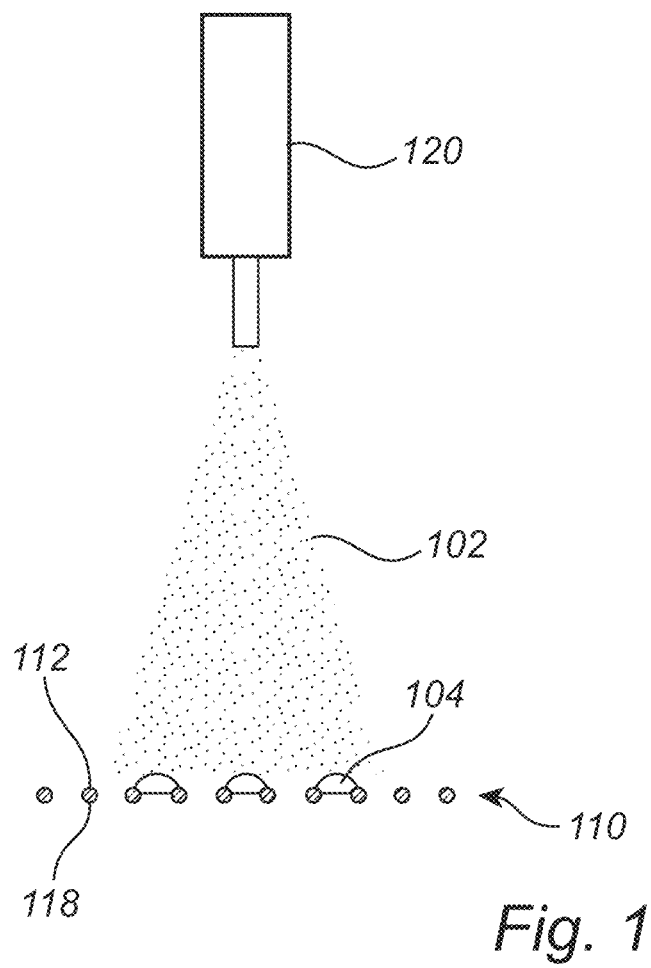

FIG. 1 illustrates forming of microdroplets 102 of a solvent and a solute material and depositing the microdroplets 102 on a micro-structured mesh 110. The deposited microdroplets 102 coalesce on the micro-structured mesh 110 into larger droplets 104.

The microdroplets 102 may be deposited by spray coating using a microdroplet generator 120. For instance, the microdroplets may be deposited using ultrasonic spray coating (USSC), which may involve utilizing vibrations in ultrasonic range, such as 20-180 kHz, inside a nozzle to atomize small droplets that are output from the nozzle. A flow of a carrier gas, such as nitrogen, may be provided for forcing the microdroplets to impinge on an upper surface 112 of the micro-structured mesh 110 and be deposited thereon.

The ultrasonic vibrations may be produced by mechanical expansion and contraction of piezoelectric transducer(s) inside the nozzle. A frequency of the ultrasonic vibrations may control a size of the microdroplets 102, such that higher frequencies may be used for generating smaller microdroplets 102.

It should be realized that USSC is not necessarily used for forming and depositing of the microdroplets 102 on the micro-structured mesh 110. According to alternatives, other spray coating techniques or other techniques of generating microdroplets and forcing the microdroplets onto the micro-structured mesh 110 may be used. For instance, pressurized spray coating may be used.

USSC is advantageous in that USSC provides a capability of forming homogeneous microdroplets 102 having a size smaller than 100 μm. Further, velocity of the microdroplets 102 towards the micro-structured mesh 110 may be easily controlled by controlling a pressure of the carrier gas. This may reduce singularity which may exist for other spray coating technologies, i.e. velocity and/or temperature-induced droplet interaction with the micro-structured mesh 110.

The solvent may be any liquid that is suitable for carrying the solute material and for wetting of the micro-structured mesh 110 as well as a surface of the substrate 100. The solvent to be used may be selected based on the solute material to be used, material used in the micro-structured mesh 110 and on the surface of the substrate 100 as well as on a surface tension of the liquid. For instance, water or isopropanol alcohol (IPA) may be used as a solvent, but it should be realized that other liquids may be used as solvent instead.

The solute material is to be used for forming a thin film on the surface of the substrate. Thus, the solute material may be selected based on the material desired for forming the thin film. The solute material may thus be dependent on an application of the substrate with the thin film arranged thereon. The thin film may be used to provide a functionality to a device in many different fields of application, such as for organic photo-voltaic devices, organic light-emitting diodes, micro-batteries, wear-resistant coatings, bio-medical devices, micro-electro-mechanical systems, piezoelectric films, etc. Hence, the solute material may be selected to provide the desired functionality in the fields of application in which it is to be used.

The solute material may typically be a polymer which is suitable for forming a thin film. For instance, the solute material may be poly(3,4-ethylenedioxythiophene) polystyrene sulfonate (PEDOT:PSS), which may be used with water as solvent and may for instance be used in organic electronics providing low sheet resistance and optical transparency, or 80% ethoxylated polyethyleneimine (PEIE), which may be used with IPA as a solvent and may for instance be deposited on an indium tin oxide (ITO) electrode for providing low dark current and high detectivity of a photodetector.

The diameter of the microdroplets 102 formed by the microdroplet generator 120 may be smaller than a capillary length of the solvent, such as at least a factor 10 times smaller than the capillary length of the solvent. The size and shape of the microdroplets 102 when impinging on the micro-structured mesh 110 affect wetting of the micro-structured mesh 110. For a small microdroplet 102, where the size of the microdroplet 102 is smaller than the capillary length, an effect of surface tension is dominant over gravity such that spherical microdroplets 102 are formed. This may be particularly suitable for providing a well-controlled wetting of the micro-structured mesh 110.

The capillary length $l_c$ is given by:

$$l_c = \sqrt{\frac{\rho g}{\gamma}},$$

where ρ is density and γ is surface tension of the liquid solvent and g is gravitational acceleration. For instance, the capillary length of water is approximately 2.7 mm.

The diameter of the microdroplets 102 formed by the microdroplet generator 120 may for instance be smaller than 200 μm or smaller than 100 μm.

FIGS. 2*a-b* illustrate details of the micro-structured mesh 110 according to an embodiment. FIG. 2*a* illustrates a pattern of the micro-structured mesh 110 and FIG. 2*b* is an enlargement of details of the micro-structured mesh 110.

The micro-structured mesh 110 may be formed by interlaced threads 114. The threads 114 may be arranged in two sets of parallel lines, wherein the sets are perpendicular to each other. A distance between adjacent threads 114 may be equal between the two sets, such that square spacings 116 may be formed between the threads 114. The micro-structured mesh 110 may form a regular mesh pattern, which is identical throughout an area of the micro-structured mesh 110.

The threads 114 may be formed from a material that is lyophobic to the solvent, i.e. having little or no affinity to the liquid of the solvent. If water is used as the solvent, the threads 114 may thus be formed by a hydrophobic material. The use of a lyophobic or hydrophobic material of the threads 114 is advantageous in inducing forced dynamic wetting of the surface of the substrate 100 as will be described later. The use of a lyophobic or hydrophobic material of the threads 114 further controls wetting of the micro-structured mesh 110 and forming of coalesced droplets on the micro-structured mesh 110.

According to an embodiment, the micro-structured mesh 110 may be formed by polyester threads 114.

The mesh 110 is referred to as a micro-structured mesh 110 because the mesh 110 has features in micrometer scale. Cross-sectional dimension of the threads 114 and a distance between adjacent threads for defining spacings 116 may thus be in micrometer scale.

The spacings 116 may be dimensioned in relation to the diameter of the formed microdroplets 102 such that the microdroplets 102 will mainly be deposited on the micro-structured mesh 110 and will not pass through the spacings 116. However, the spacings 116 may further be dimensioned to allow droplets that are formed on the upper surface 112 of the micro-structured mesh 110 to extend into the micro-structured mesh 110 and possibly protrude from a bottom surface 118 of the micro-structured mesh 110. The spacings 116 should thus be sufficiently large to allow liquid of the droplets to be drawn through the micro-structured mesh 110 by capillary force, as will be explained in further detail below.

According to an embodiment, the distance between adjacent threads 114 may be smaller than five times, such as smaller than three times, a diameter of the formed microdroplets 102. This may imply that initially some microdroplets 102 may pass through the micro-structured mesh 110, but as droplets are starting to be deposited on the micro-structured mesh 110, microdroplets 102 will be captured by the droplets 104 formed on the micro-structured mesh 110 such that microdroplets 102 will no longer be able to pass through the micro-structured mesh 110.

However, it should be realized that the size of the spacings 116 may alternatively correspond to the diameter of the microdroplets 102 such that the microdroplets 102 cannot pass unaffected through the micro-structured mesh 110.

The size of the cross-section of the threads 114 may be similar to the distance between adjacent threads 114. This implies that a relatively large proportion of the upper surface 112 of the micro-structured mesh 110 is defined by the threads 114, such that a likelihood that a microdroplet 102 will impinge on a thread 114 is large. This implies that there is a relatively low risk of microdroplets 102 passing through the micro-structured mesh 110 even if the microdroplets 102 have a smaller diameter than the distance between adjacent threads 114.

For instance, the threads 114 may have a circular cross-section and a diameter of the threads 114 may be smaller than five times, such as smaller than three times, a diameter of the formed microdroplets 102.

According to an embodiment, the distance between the threads 114 is smaller than 200 μm or smaller than 100 μm. Further, the diameter of the threads 114 may be smaller than 200 μm or smaller than 100 μm.

Figure 2A:
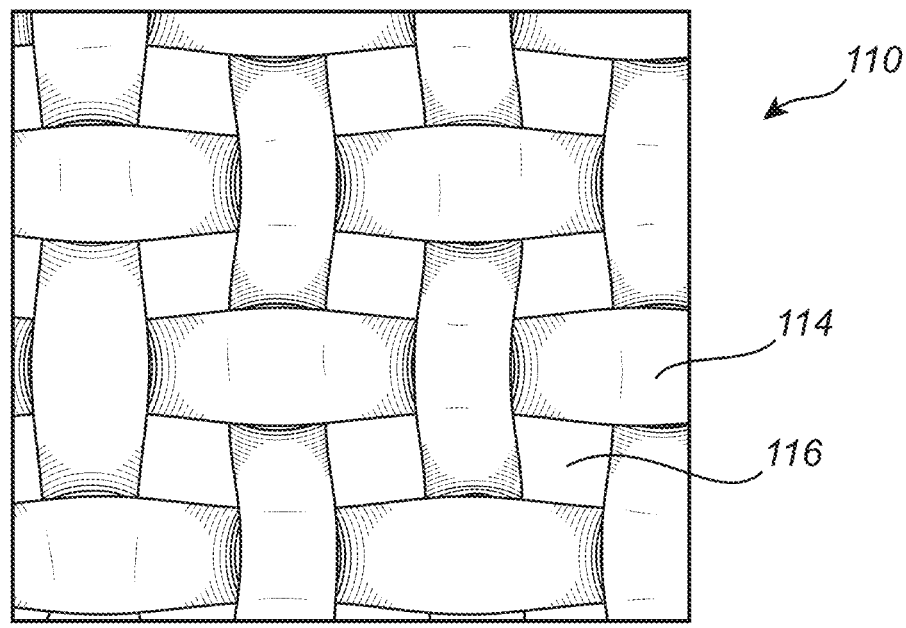
Figure 2B:
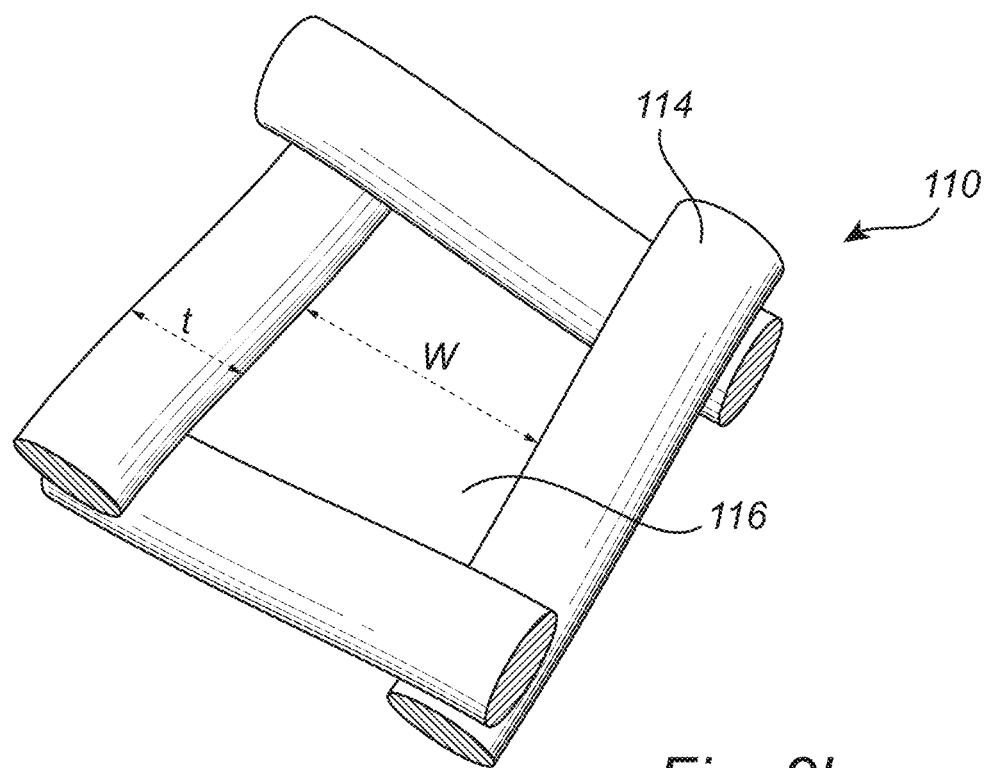

In a particular embodiment illustrated in FIG. 2b, the diameter t of the threads may be 40 μm and the distance W between adjacent threads 114 may be 50 μm.

Referring now to FIGS. 3a-c and 4a-c, coalescing of microdroplets 102 into larger droplets 104 on the micro-structured mesh 110 will be described in further detail.

Thousands of microdroplets 102 may be generated by the microdroplet generator 120 and may hit the micro-structured mesh 110 within the same time-frame. These microdroplets 102 will coalesce and form larger droplets 104, which may be called milli-droplets below. The formation and profile of the milli-droplets 104 upon coalescence of microdroplets 102 depends on a spreading coefficient S and a geometry of texture of the upper surface 112 of the micro-structured mesh 110. The spreading coefficient S is usually calculated to distinguish between different wetting states. In general, the spreading coefficient S represents surface energy difference between partial and complete wetting stages, i.e. at partial wetting, an equilibrium contact angle θ between the droplet 104 and the upper surface 114 would be between 90° and 180° and at complete wetting, the equilibrium contact angle θ would be 180°.

The spreading coefficient S may be expressed as:

$$S = \gamma_{sv} - (\gamma_{sl} + \gamma_{iv}),$$

based on thermodynamic equilibrium between three surface tensions: solid/vapor ($\gamma_{sv}$), solid/liquid ($\gamma_{sl}$), and liquid/vapor ($\gamma_{iv}$).

If the spreading coefficient is equal to or more than zero, then the droplet 104 completely wets the surface and if it is less than zero then the droplet 104 partially wets the surface. Based on the surface tension of the liquid and the surface energy of the material of the threads 114 of the micro-structured mesh 110, S could be determined.

Below, an embodiment is discussed, wherein a micro-structured mesh 110 formed by threads 114 of low surface energy polyester (43 mN/m) is used. Further, two different liquids at opposite ends of surface tension spectrum may be used with the micro-structured mesh 110. It should be realized that other materials with other properties may be used in the micro-structured mesh 110 and that other liquids may be used.

For water as a solvent (surface tension γ=72 mN/m), being a high surface tension liquid, partial wetting occurs. Therefore, there could be two situations, a) the deposited microdroplets 102 would coalesce into a sizable hemispherical milli-droplet 104, b) the microdroplets 102 would be pushed towards the bottom surface 118 of the micro-structured mesh 110 by a force of the carrier gas carrying the microdroplets 102. The latter would happen only if the diameter of the microdroplet 102 is smaller than the spacings 116 of the micro-structured mesh 110.

Figure 3A:
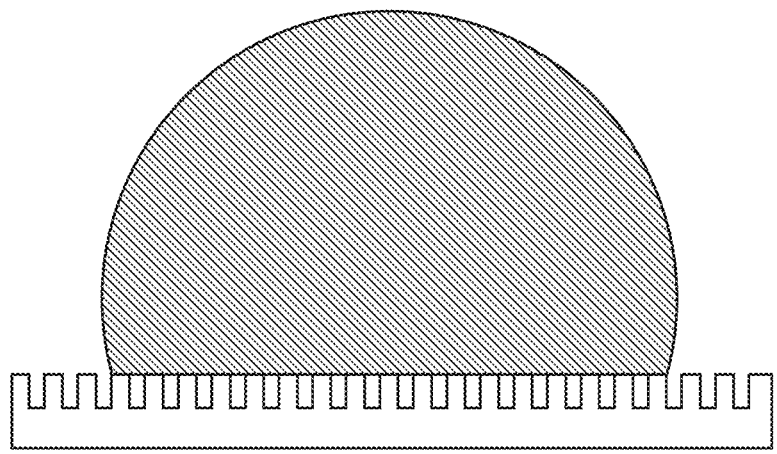

In FIG. 3a, a Cassie-Baxter model of partial wetting of a textured surface is illustrated. As shown, the droplet may be formed on top of the textured surface with air trapped underneath the droplet. Growth and profile of the droplet are dominated by the roughness of the surface texture.

Figure 3B:
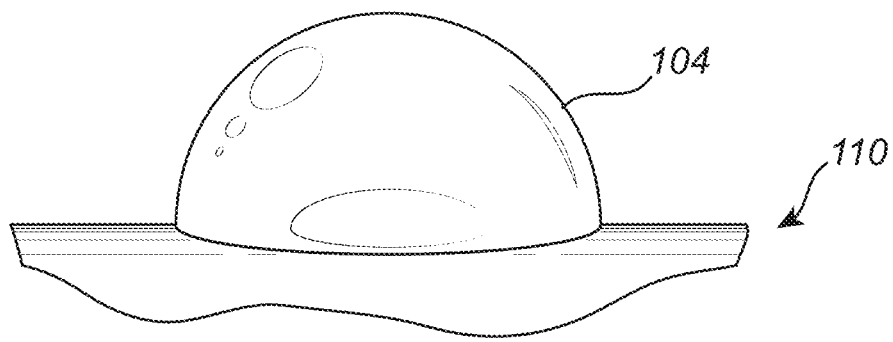

In FIG. 3b, a cross-section through a droplet 104 formed on the micro-structured mesh 110 is illustrated. When the droplets 104 are formed on the micro-structured mesh 110, the Cassie-Baxter state of wetting may exhibit an air pocket at a center of the droplet 104. At edges of the droplet 104, the droplet may extend into the micro-structured mesh 110.

In the case of FIG. 3b, a relation of an apparent contact angle θ* is given by the Cassie-Baxter model, $\cos(\theta^*) = r\varphi_s \cos(\theta_E) + \varphi_s - 1$, where r is a roughness parameter of the micro-structured mesh, $\theta_E$ is an equilibrium contact angle between the liquid droplet 104 and a smooth flat substrate of the material of the threads 114, 1−$\varphi_s$ is a fraction of liquid/solid interface where the droplet 104 is in contact with the surface 112. Since $\varphi_s \leq 0$, the apparent contact angle θ* is larger than or equal to 180° even for a surface whose $\theta_E$<90°.

Figure 3C:
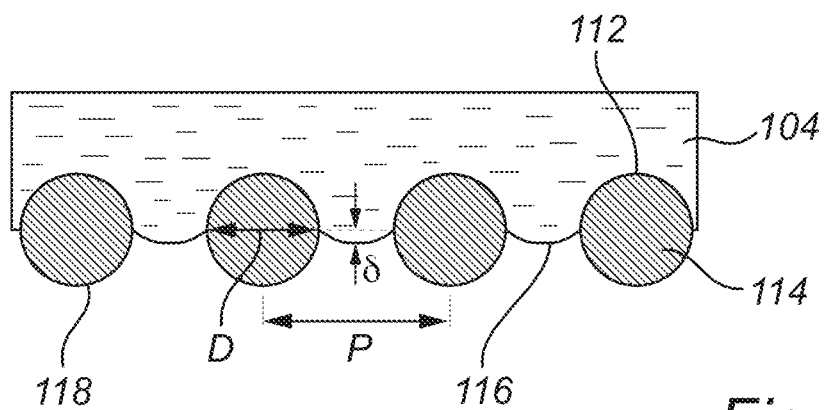

As further illustrated in FIG. 3c, which is an enlargement of an edge of the droplet 104 in FIG. 3b, the droplet 104 may protrude into the micro-structured mesh 110. Protrusion of the droplet into the micro-structured mesh may depend on thickness of threads 114 of the micro-structured mesh 110 and on a distance between adjacent threads 114. The droplet may form a meniscus around the thread 114, having a droop from a center of the micro-structured mesh 110 between the upper surface 112 and the bottom surface 118. At equilibrium, a maximum droop would be at a center of the spacing 116 of the mesh 110, with a droop length of δ=($\sqrt{2}$P−D)²/8$r_d$, where $r_d$ is radius of the droplet 102, D is a thickness of the threads 114, and P is a pitch of the micro-structured mesh 110.

Figure 4A:
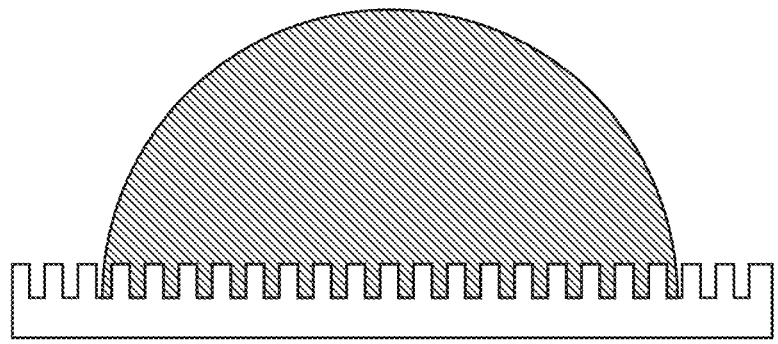
Figure 4B:
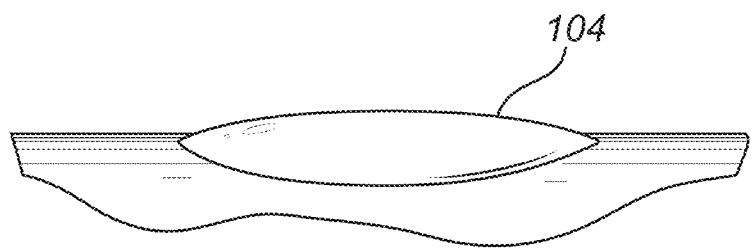
Figure 4C:
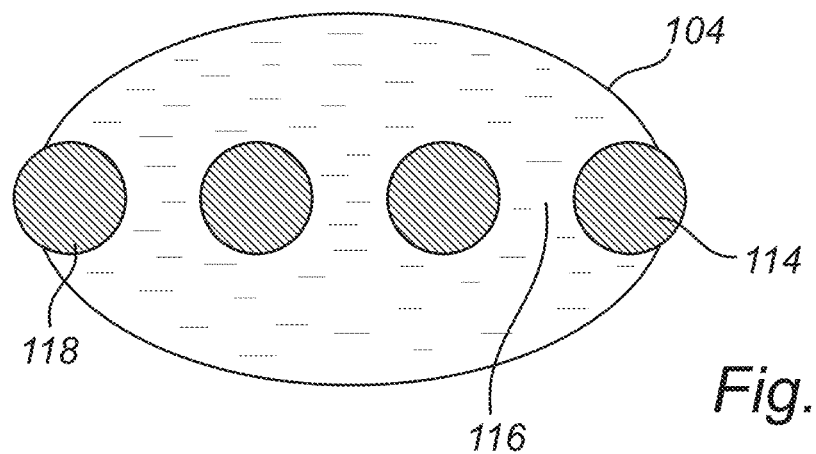

Referring now to FIGS. 4a-c, complete wetting will be discussed. For IPA as a solvent (surface tension γ=22 mN/m), being a low surface tension, wetting would be complete, i.e. the liquid will completely wet the threads 114 of the micro-structured mesh 110. Any further deposition would result in increasing the thickness of the deposited droplet 104 on the thread 114 of the mesh 110. The droplet 104 may then grow until the droplets 104 from two neighboring threads 114 reach a critical thickness (W/2, W being the distance between the neighboring threads). Then, coalescence would result in a continuous liquid film being formed between the neighboring threads 114 extending across a spacing 116. Upon further deposition of the microdroplets 102, the continuous thin film between the threads 114 would keep spreading over further neighboring threads 114 and simultaneously grows both in width and thickness. The milli-droplet 104 would acquire a hemispherical shape, with a top half being above the mesh 110 and a bottom half being below the mesh 110.

In FIG. 4a, a Wenzel model of complete wetting of a textured surface is illustrated. As shown, the droplet may be formed to extend into the textured surface. In FIG. 4b, a cross-section through a droplet 104 formed on the micro-structured mesh 110 is illustrated. When the droplets 104 are formed on the micro-structured mesh 110, the Wenzel state of wetting may exhibit the droplet 104 being partly formed above the micro-structured mesh 110 and partly below the micro-structured mesh 110.

As further illustrated in FIG. 4c, the droplet 104 may protrude from the bottom surface 118 of the micro-structured mesh 110. A curvature of the droplet 104 is governed by the Laplace equation and the curvature is the same on top and bottom of the mesh 110. The Laplace equation relates the pressure inside the droplet 104 to its curvature. Further increase in deposition of microdroplets 102 increases the width and thickness of the coalesced droplet 104 until a size of the droplet 104 reaches the capillary length. For the complete wetting, e.g. for the case of IPA wetting on the micro-structured mesh, the relationship between the apparent or macroscopic contact angle (θ*) to the equilibrium contact angle ($\theta_E$) between the liquid droplet 104 and a smooth flat substrate formed by the material of the threads 114 is given by the Wenzel equation, cos(θ*)=r cos($\theta_E$), where r is the roughness parameter that describes the ratio between the actual area wetted by the liquid to the area projected onto a flat substrate.

As illustrated in the discussion above in relation to FIGS. 3a-3c and 4a-4c, spreadability of the deposited liquid over the micro-structured mesh 110 depends i.a. on the surface tension of the solvent being used.

Figure 5:
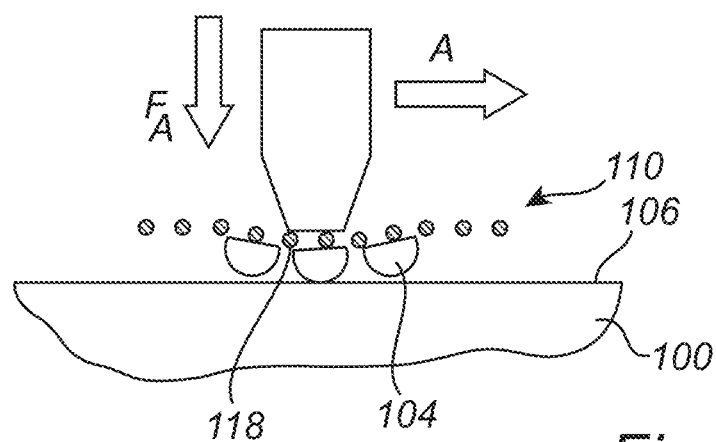
FIG. 5 is a schematic view illustrating arranging a surface of a substrate in close relation to the micro-structured mesh according to an embodiment.

Referring now to FIG. 5, the surface 106 of the substrate 100 on which the thin film material is to be applied is arranged in close relation to the bottom surface 118 of the micro-structured mesh 110 on which the droplets 104 have been formed.

The arranging of the surface 106 of the substrate 100 in close relation to the bottom surface 118 of the micro-structured mesh 110 may thus take place after the microdroplets 102 have been deposited and coalesced to milli-droplets 104 on the upper surface 112 of the micro-structured mesh 110. The arranging of the surface 106 of the substrate 100 in close relation to the bottom surface 118 of the micro-structured mesh 110 may involve acting on the micro-structured mesh 110 for moving the micro-structured mesh 110 or acting on the substrate 100 for moving the substrate 100 or both. Movement of the micro-structured mesh 110 and/or the substrate 100 may be performed in a direction perpendicular to the bottom surface 118 of the micro-structured mesh 110 and/or to the surface 106 of the substrate 100. However, it should be realized that movement may alternatively be performed in a lateral direction parallel to the bottom surface 118 of the micro-structured mesh 110 and/or to the surface 106 of the substrate 100. In such case, the micro-structured mesh 110 and/or the substrate 100 may be moved in a plane for aligning the bottom surface 118 of the micro-structured mesh 110 above the surface 106 of the substrate 100. It should be further realized that a combination of a perpendicular and parallel movement may be performed.

Hence, according to an embodiment, a force may be exerted on the substrate 100 for bringing the surface 106 of the substrate 100 in close relation to the bottom surface 118 of the micro-structured mesh 110. The force may be exerted on the substrate 100 for moving the entire substrate 100, such as moving a carrier holding the substrate 100 for moving the substrate 100 with the carrier. However, in particular if the substrate 100 is flexible material, such as being defined by a foil or film that may form a web, the force may be exerted on the substrate 100 for bringing a portion of the substrate 100 in close relation to the bottom surface 118 of the micro-structured mesh 110. Thus, the portion of the substrate 100 may form the surface 106 of the substrate 100 on which the thin film material is to be applied. If the substrate 100 is formed by a web, the web may be continuously, or intermittently, moved past a position at which thin film material is applied onto the surface 106. Thus, as the web is moved, an entire surface 106 of the web may eventually be provided with a thin film.

The web may follow a path which may be defined e.g. by rollers. Thus, as the web is moved along its path, forces may act on the web so as to bring the web in close relation to the bottom surface 118 of the micro-structured mesh 110 at a position along the path of the web in which liquid of the droplets 104 is to be transferred from the micro-structured mesh 110 to the surface 106.

According to another embodiment, as illustrated in FIG. 5, a force, as illustrated by arrow FA, may be exerted on the micro-structured mesh 110 for bringing the surface 106 of the substrate 100 in close relation to the bottom surface 118 of the micro-structured mesh 110. The force may be exerted on the micro-structured mesh 110 for moving the entire micro-structured mesh 100, such as moving a frame in which the micro-structured mesh 110 is arranged for moving the micro-structured mesh 110 with the frame.

However, the micro-structured mesh 110 may be flexible so as to allow deformation of the micro-structured mesh 110, as illustrated in FIG. 5. In such case, the force may be exerted on the micro-structured mesh 110 for bringing a portion of the bottom surface 118 of the micro-structured mesh 110 in close relation to the surface 106 of the substrate 100. Thus, the microdroplets 102 may be deposited on the portion of the bottom surface 118 of the micro-structured mesh 110 and then a force may be applied on the portion for bringing the portion of the micro-structured mesh 110 in close relation to the surface 106 of the substrate 100 for allowing the liquid of the droplets 104 to be transferred onto the surface 106 of the substrate 100.

For instance, a substrate 100, e.g. a substrate 100 provided in the form of a web, may be arranged to extend parallel to the micro-structured mesh 110 when the micro-structured mesh 110 is undeformed. Then, droplets 104 may be formed along a first strip, forming a first portion of the micro-structured mesh 110, extending between two edges of the micro-structured mesh 110. Once the droplets 104 are ready to be transferred onto the surface 106 of the substrate 100, an actuator may exert a force on the first strip to bring the first strip towards the surface 106 of the substrate 100. While the liquid in the droplets 104 on the first strip of the micro-structured mesh 110 is transferred onto the surface 106 of the substrate 100, microdroplets 102 may be deposited at a second strip, forming a second portion of the micro-structured mesh 110, adjacent to the first portion, so that the microdroplets 102 are coalesced into droplets 104 on the second portion. Then, when the liquid of the droplets 104 has been transferred to the surface 106 of the substrate 100, the actuator may be moved in a direction, illustrated by arrow A in FIG. 5, or the micro-structured mesh 110 may be moved along the edges of the micro-structured mesh 110 so as to act on the second portion of the micro-structured mesh 110 and transfer liquid from the droplets 104 onto another portion of the surface 106 of the substrate 100.

This may allow transferring of liquid onto a web that may be moved past a position in which a liquid is applied onto the web for eventually forming a thin film on the web. Thus, the process of applying a thin film onto a substrate may be made roll-to-roll compatible, which implies that a very high throughput of thin film formation may be provided.

The surface 106 of the substrate 100 may be brought in so close relation to the micro-structured mesh 110 that a capillary force may draw liquid from the droplets 104 onto the surface 106 of the substrate 100. As described above, the microdroplets 102 may be deposited to allow coalescing of microdroplets 102 into droplets 104 protruding from the bottom surface 118 of the micro-structured mesh 110. Thus, the surface 106 of the substrate 100 would come in contact with the droplets 104 before being in contact with the bottom surface 118 of the micro-structured mesh 110. In such case, the surface 106 of the substrate 100 may be arranged in contact with the droplets 104 for allowing liquid of the droplets 104 to be drawn by a capillary force onto the surface 106 of the substrate 100.

It should be realized that, when a force acts on a flexible micro-structured mesh 110, the micro-structured mesh 110 may be deformed such that the size of spacings 116 may be increased. This may imply that a relation of the droplets 104 and the micro-structured mesh 110 may change so that the droplets 104 extend further into the micro-structured mesh 110 or protrude (or protrude further) from the bottom surface 118 of the micro-structured mesh 110. This may facilitate the liquid of the droplets 104 being drawn by capillary force onto the surface 106 of the substrate 100.

It should be realized that the surface 106 of the substrate 100 need not be in contact with the droplets 104 in order to allow a capillary force to draw liquid of the droplets 104 onto the surface 106 of the substrate 100. However, the substrate 100 should be brought relatively close to the droplets 104 in order for the capillary force to be sufficiently strong to draw the liquid of the droplets 104 onto the surface 106 of the substrate 100.

In an embodiment, particularly if the droplets 104 do not protrude from the bottom surface 118 of the micro-structured mesh 110, the surface 106 of the substrate 100 may be brought in contact with the micro-structured mesh 100. However, this may require the micro-structured mesh 110 to be very clean to avoid contamination in the thin film material being applied onto the surface 106 of the substrate 100. Therefore, it may be beneficial to arrange the surface 106 of the substrate 100 so as not to be in contact with the micro-structured mesh 110. Also, the capillary force that acts to draw the liquid of the droplets 104 onto the surface 106 of the substrate 100 may also pull the micro-structured mesh 110 towards the surface 106 of the substrate 100. Thus, it may be beneficial to have a distance between the surface 106 of the substrate 100 and the bottom surface 118 of the micro-structured mesh 110 so that contact is not made during transfer of liquid from the droplets 104 to the surface 106 of the substrate 100.

According to an embodiment, the surface 106 of the substrate 100 is arranged at a distance of at least 100 µm from the bottom surface 118 of the micro-structured mesh 110. This may be used regardless whether the droplets 104 protrude from the bottom surface 118 of the micro-structured mesh 110 or not. The surface 106 of the substrate 100 may be arranged with a distance between the surface 106 of the substrate 100 and the bottom surface 118 of the micro-structured mesh 110 being smaller than the capillary length of the solvent. This may imply that the capillary force may be strong enough to draw liquid of the droplets 104 onto the surface 106 of the substrate 100, even if the surface 106 of the substrate 100 is not initially in contact with the droplets 104.

Regardless of the surface tension of the solvent being used, once the droplet 104 touches the surface 106 of the substrate 100, the liquid will be drawn from the droplets 104 onto the surface 106 of the substrate 100 in a similar manner.

Figure 6:
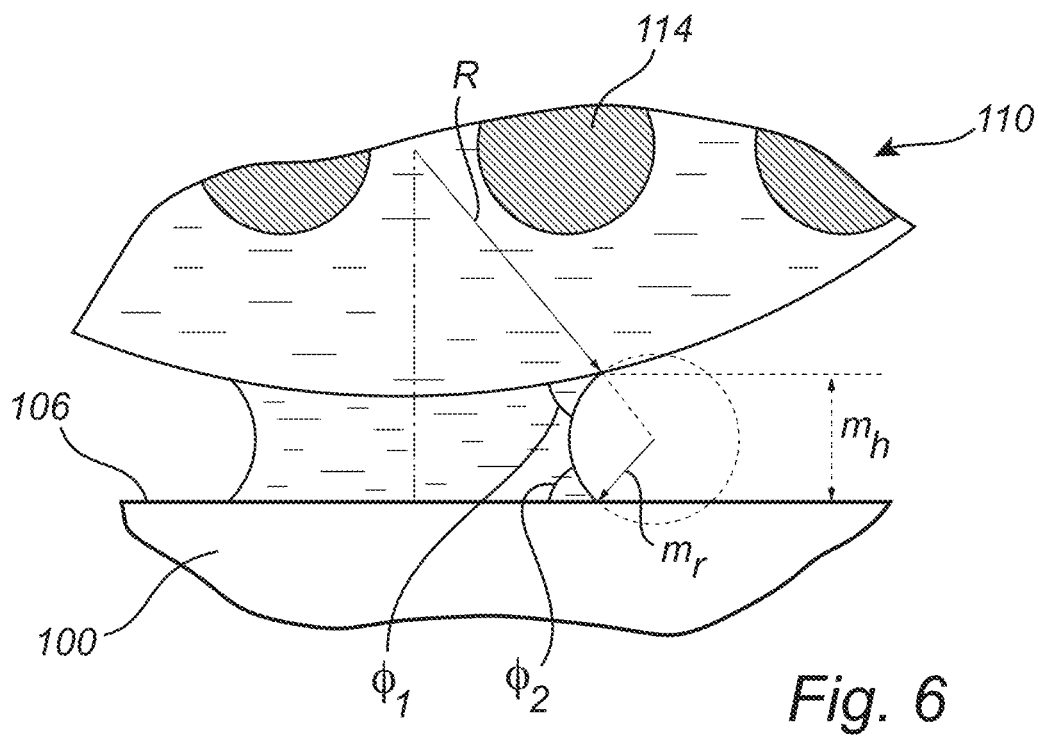
FIG. 6 is a schematic view illustrating liquid of a droplet being drawn by capillary force from the micro-structured mesh onto the surface of the substrate.

The capillary force arising between the substrate 100, the liquid on the micro-structured mesh 110 and an air interface would result in the spreading of the liquid onto the surface 106 of the substrate 100 in order to reach a global minimum of the surface energy of the substrate 100. This initiates a hydrodynamic flow of the droplet 104. Once the liquid deposited on the micro-structured mesh 110 touches the surface 106 of the substrate 100, the liquid will be drawn from the droplets 104 and would form a meniscus between the micro-structured mesh 110 and the substrate 100, as illustrated in FIG. 6.

An attractive force is generated by the formed meniscus. The attractive force is mainly due to the existence of the surface tension of the liquid around the periphery of the meniscus and due to the reduced pressure inside the meniscus as compared to the capillary pressure. This attractive force then pulls the micro-structured mesh 110 towards the substrate 100 and drains the liquid on the upper surface 112 of the micro-structured mesh 110. By assuming the height of the meniscus $m_h$ to be smaller than the capillary length $l_c$, the capillary force F is given by:

$$F = 2\pi\gamma R\left(2c - \frac{d}{m_r}\right),$$

where $\gamma$ is the surface tension of the liquid, R is a droop radius of the droplet 104, $\beta$ is a filling angle, d is a distance between the drooped liquid and substrate 100, and $m_r$ is a radius of the meniscus, with constant c being given by:

$$c = \frac{\cos(\beta + \Phi_1) + \cos(\Phi_2)}{2},$$

where $\Phi_1$ and $\Phi_2$ are the contact angle of the liquid meniscus with the drooped liquid and with the substrate 100, respectively.

This force created would be then applied by the micro-structured mesh 110 on the liquid which influences the wetting behavior and hence forced dynamic wetting will happen. Also, as there would be many milli-droplets 104 formed, these individual milli-droplets 104 would simultaneously try to wet the surface 106 of the substrate 100. Finally, without presence of the micro-structured mesh 110, these multiple droplets 104 would form a liquid film on the surface 106 of the substrate 100 with an abrupt increase in thickness of the liquid film when the droplets 104 deposited on the micro-structured mesh 110 interfere constructively on the surface 106 of the substrate 100. Fortunately, the presence of the micro-structured mesh 110 prevents the formation of abrupt thin liquid coatings, due to the applied force by the micro-structured mesh 110 over the liquid film, which resembles the force exerted by nano-hairs of water striders on a liquid. The hydrostatic pressure inside the liquid increases, which forces the liquid to flow in lateral dimensions. This induces dynamic wetting, which follows the hydrodynamic flow induced by the capillary force. The combination of capillary force and the external force applied by the micro-structured mesh 110 would assure that the liquid wets the surface 106 irrespective of the solvent and type of substrate 100 being used.

Figure 7:
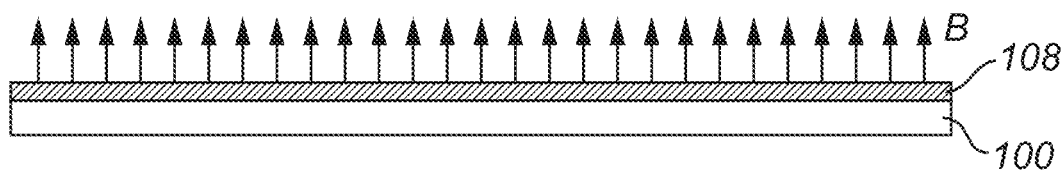
FIG. 7 is a schematic view illustrating evaporation of solvent from a liquid film formed on the surface of the substrate.

Referring now to FIG. 7, the liquid film 108 is shown on the surface 106 of the substrate 100.

After the liquid film with uniform thickness has been formed on the surface 106 of the substrate 100, the bottom surface 118 of the micro-structured mesh 110 may be separated from the surface 106 of the substrate 100. Similar to the description above for bringing the surface 106 of the substrate 100 in close relation to the bottom surface 118 of the micro-structured mesh 110, either the micro-structured mesh 110 or the substrate 100 or both may be moved for bringing the surface 106 of the substrate 100 away from the bottom surface 118 of the micro-structured mesh 110. Again, this may imply that the entire micro-structured mesh 110 and/or the entire substrate 100 is moved or that a portion of the micro-structured mesh 110 and/or a portion of the surface 106 of the substrate 100 is moved.

It should be realized that separating the micro-structured mesh 110 from the substrate 100 does not necessarily imply that the micro-structured mesh 110 and the substrate 100 have been in contact with each other, but rather that a distance between the micro-structured mesh 110 and the substrate 100 is increased.

When the micro-structured mesh 110 has been separated from the substrate 100, a liquid film 108 is left on the surface 106 of the substrate 100. The liquid film 108 may have a uniform or at least almost uniform thickness and may extend over a large area or an entire area of the surface 106 of the substrate 100.

The solute material is arranged within the solvent which forms the liquid film 108. After the liquid film 108 has been applied to the surface 106 of the substrate 100, the solvent may be allowed to evaporate leaving the solute material on the surface 106 of the substrate 100 so as to form a very thin film of the solute material on the substrate 100.

Since the liquid film 108 has a uniform or almost uniform thickness, evaporation of the solvent may occur with a constant or almost constant evaporative flux profile (illustrated by arrows B in FIG. 7) over the area of the surface 106. Thanks to the constant evaporative flux profile, there will not be any substantial flow laterally within the liquid film 108 during evaporation, such that the solute material may form a thin film having a uniform or almost uniform thickness and formation of coffee rings in the thin film is avoided.

The solvent of the liquid film 108 may be allowed to evaporate spontaneously based on an ambient temperature in a manufacturing environment during producing of the thin film on the substrate 100. However, in order to increase control of evaporation, the substrate 100 may be exposed to an increased temperature, which may promote evaporation of the solvent of the liquid film 108.

The substrate 100 may be generally exposed to an increased temperature, e.g. by bringing the substrate 100 into a space (oven) with an increased temperature (above room temperature). However, the substrate 100 may alternatively be exposed to a local increase in temperature by providing local heating to the liquid film 108 on the surface 106 of the substrate 100.

Evaporation of the solvent may also or alternatively be promoted by controlling humidity of ambience and/or controlling an air flow above the liquid film.

The evaporation may be controlled for reducing a time required for fully evaporating the solvent. However, it may be desired that the solvent of the liquid film 108 changes from liquid form to gaseous form through evaporation, without any boiling occurring. Boiling could cause movements within the liquid that may affect the thin film of the solute material that is eventually formed. Hence, the control of evaporation may involve exposing the substrate 100 to an increased temperature, while ensuring that the temperature of the liquid is not close to a boiling point.

Control of evaporation may be different, e.g. using different parameters, dependent on the solvent used. For instance, the ambient temperature may be different depending on the solvent used to promote evaporation while ensuring that the temperature of the solvent does not reach the boiling point.

As mentioned, after evaporation of the solvent, the solute material may form a thin film having a uniform or almost uniform thickness. A very thin film of the solute material may be formed, and thickness of the thin film may be dependent on requirements of the field of application in which the thin film on the substrate 100 is to be used. Thus, in embodiments, the thickness of the thin film may be smaller than 100 nm, such as smaller than 50 nm, such as smaller than 15 nm. It is noted that the method allows applying of thin film material to the surface 106 of the substrate 100 for forming exceptionally thin films with uniform thickness, such as thin films having a thickness smaller than 15 nm.

The thickness of the thin film may be controlled by controlling different parameters for applying the thin film material onto the surface 106 of the substrate 100. However, when control of the thickness of the thin film is desired, controlling concentration of the solute material in the microdroplets 102 offers a suitable and easy manner of controlling the thickness of the thin film.

The controlling of the concentration of the solute material has a direct relation to the thickness of the thin film being formed on the substrate 100. Thus, the thickness of the thin film may be simply controlled by controlling the concentration of the solute material in the microdroplets formed by the microdroplet generator 120.

Figure 8:
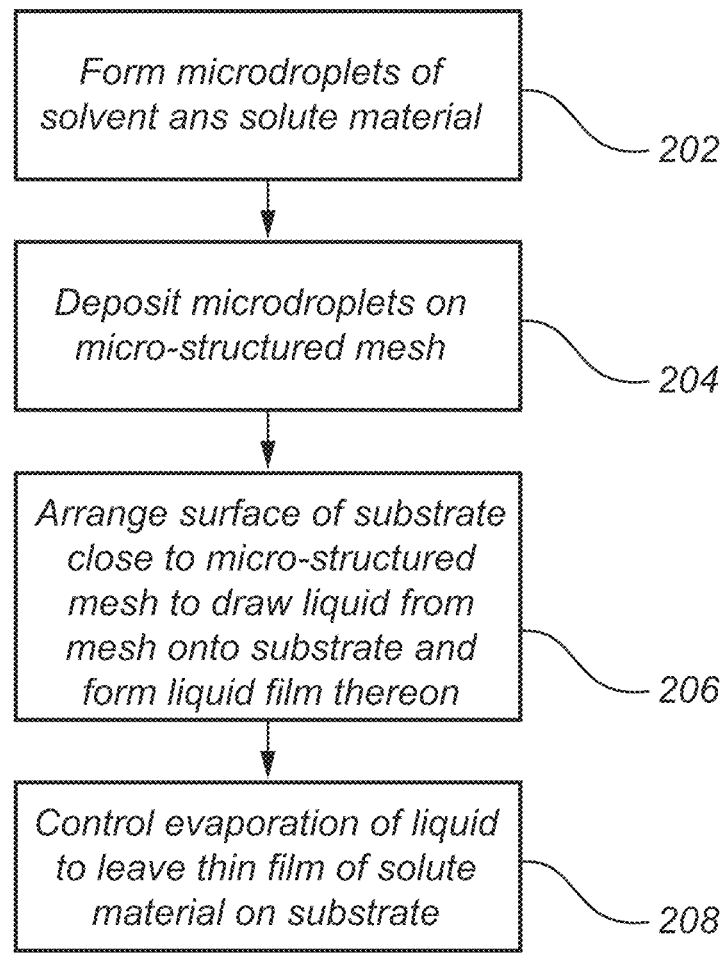
FIG. 8 is a flow chart of a method according to an embodiment.

Referring now to FIG. 8, the method for applying thin film material onto a substrate and eventually forming a thin film on the substrate according to an embodiment is summarized.

The method comprises forming 202 microdroplets 102 of a solvent and a solute material, wherein the solute material is the thin film material.

The method further comprises depositing 204 the microdroplets 102 on the upper surface 112 of the micro-structured mesh 110. The microdroplets 102 are then allowed to coalesce on the micro-structured mesh 110 into droplets 104 extending at least into the micro-structured mesh 110 and possibly protruding from the bottom surface 118 of the micro-structured mesh 110.

The method further comprises arranging 206 the surface 106 of the substrate 100 in close relation to the bottom surface 118 of the micro-structured mesh 110. This implies that a capillary force will draw liquid of the droplets 104 from the micro-structured mesh 110 onto the surface 106 of the substrate 100. Further, the micro-structured mesh 110 provides a force on the liquid and forced dynamic wetting of the surface 106 of the substrate 100 is provided to form a liquid film 108 on the surface 106 of the substrate 100.

The liquid film 108 may be formed with a uniform thickness on the surface 106 of the substrate 100. The method may further comprise controlling 208 evaporation of the liquid of the solvent in the liquid film 108 such that the thin film material is left on the surface 106 of the substrate 100 to form a thin film of uniform thickness on the substrate 100.

Referring now to FIG. 9, an apparatus 300 for applying thin film material onto the substrate 100 according to an embodiment will be described.

The apparatus 300 comprises a microdroplet generator 120 for generating microdroplets 102 of a solvent and a solute material forming the thin film material. The microdroplet generator 120 may be configured to generate and output a directed spray of microdroplets 102, for instance using USSC, but it should be realized that the microdroplet generator 120 may generate microdroplets 102 in different manners.

The apparatus 300 further comprises the micro-structured mesh 110. The micro-structured mesh 110 is arranged in the apparatus 300 in relation to the microdroplet generator 120 so as to receive microdroplets 102 on the upper surface 112 of the micro-structured mesh 110. Thus, the microdroplet generator 120 and the micro-structured mesh 110 may be arranged such that the directed spray output by the microdroplet generator 120 impinges on the micro-structured mesh 110.

The micro-structured mesh 110 may thus be arranged in the apparatus 300 such that the microdroplets 102 generated by the microdroplet generator 120 are deposited on the upper surface 112 of the micro-structured mesh 110.

The micro-structured mesh 110 is configured as explained above such that the microdroplets 102 deposited on the upper surface 112 of the micro-structured mesh 110 coalesce into larger droplets 104. The droplets 104 extend at least into the micro-structured mesh 110 and possibly the droplets 104 protrude from the bottom surface 118 of the micro-structured mesh 110.

The apparatus 300 further comprises a controller 304 for controlling a relation of the substrate 100 to the bottom surface 118 of the micro-structured mesh 110. The control of the relation of the substrate 100 to the bottom surface 118 of the micro-structured mesh 110 may be provided in many different manners, as discussed above, by controlling the substrate 100 and/or the micro-structured mesh 110, or by controlling a portion of the substrate 100 and/or a portion of the micro-structured mesh 110.

In the embodiment illustrated in FIG. 9, the substrate 100 is provided in form of a web that may be continuously transported past a position for applying thin film material onto the upper surface 106 of the substrate 100. A direction of movement of the web of the substrate 100 is indicated by arrow C in FIG. 9. Further, the micro-structured mesh 110 is also provided in form of a web that may be transported continuously along a path above the substrate 100 in the position for applying thin film material onto the upper surface 106 of the substrate 100. A direction of movement of the web of the micro-structured mesh 110 is indicated by arrow D in FIG. 9.

The apparatus 300 comprises a roller 304 in the path of the micro-structured mesh 110, such that the micro-structured mesh 110 when passing the roller 304 is brought towards the substrate 100. The microdroplet generator 120 is arranged in relation to the web of the micro-structured mesh 110 such that the microdroplets 102 are deposited on the micro-structured mesh 110 before it reaches the roller 304. The microdroplets 102 are also allowed to coalesce into larger droplets 104 before the micro-structured mesh 110 reaches the roller 304.

When the micro-structured mesh 110 reaches the roller 304, the micro-structured mesh 110 is brought in close relation to the surface 106 of the substrate 100 such that a capillary force is formed to draw liquid of the droplets 104 from the micro-structured mesh 110 onto the surface 106 of the substrate 100 and the micro-structured mesh 110 is controlled in relation to the substrate 100 such that forced dynamic wetting of the surface 106 of the substrate 100 is provided to form a liquid film 108 on the surface 106 of the substrate 100.

The micro-structured mesh 110 is configured to follow a path after passing the roller 304 such that the micro-structured mesh 110 is brought away from the substrate 100, leaving the liquid film 108 on the substrate 100.

As illustrated in FIG. 9, the substrate 100 is configured to pass the position for applying thin film material onto the upper surface 106 of the substrate 100 and after passing the position, a continuous liquid film 108 is provided on the upper surface 106 of the substrate 100.

The substrate 100 may further be configured to be transported in the apparatus 300 into a position for promoting evaporation of the solvent of the liquid film 108. The apparatus 300 may thus comprise a space which is controlled to provide an elevated ambient temperature. The substrate 100 may be transported through this space so as to allow controlled evaporation of the solvent leaving the solute material on the surface 106 of the substrate 100 forming a thin film thereon.

To corroborate flexibility of the method and apparatus described above in formation of ultra-thin coatings, PEDOT:PSS solved in water; PEIE solved in IPA, and a polymer-metal oxide composite of Zinc oxide (ZnO) nanoparticles with a diameter of 10-15 nm mixed with PEIE in IPA as a solvent were deposited on an ITO substrate with a size of 2.5×2.5 cm². The surface energy of the ITO is calculated by using Fowke's theory, and it was found to be 117.37 mN/m.

The deposition condition for all three cases are given in table 1. The distance between the substrate 100 and a nozzle for USSC is kept constant for all set of experiments at 6 cm and the room temperature is kept constant for all set of experiments at 22° C. A nitrogen pressure for carrying the microdroplets 102 towards the micro-structured mesh 110 was kept constant for all set of experiments at 1.5 kPa.

A micro-structured mesh 110 based on polyester threads 114 was used, with a dimension of thickness of the threads (t)=50 μm and the distance between neighboring threads (w)=50 μm. The micro-structured mesh 110 possessed an equilibrium water contact angle of 104.6 degrees.

Upon the deposition of microdroplets 102 on the micro-structured mesh 110, the micro-structured mesh 100 was made to touch the substrate 100 so that capillary force would draw the liquid from the upper surface 112 of the micro-structured mesh 110 and would induce forced dynamic wetting. It should be noted that the micro-structured mesh 110, which is held by capillary force, should not be in contact with the substrate 100 for a long time, such as a minute. Otherwise the deposited material could be deposited only at positions of intersections of threads 114 in the micro-structured mesh 110.

TABLE 1

Deposition parameters for various materials and solvents used

| Solute material | Substrate temp. ° C. | Solution concentration | Number of passes | Flow rate ml/min | Path speed mm/sec |
|---|---|---|---|---|---|
| PEDOT:PSS | 60 | 1 ml PEDOT:PSS in 15 ml water | 1 | 0.5 | 10 |
| PEIE | 30 | 0.01 ml in 30 ml IPA | 1 | 0.8 | 10 |
| ZnO + PEIE | 30 | 2 ml ZnO + 0.01 ml PEIE + 50 ml IPA | 1 | 0.9 | 10 |

Flow rate relates to a flow of droplets being injected into the transducer of the USSC nozzle, where the droplets are atomized into microdroplets.

Path speed relates to speed of the USSC nozzle for moving the nozzle and scanning the nozzle in two directions so as to cover an entire surface of the substrate on which the thin film is to be formed.

Numbers of passes relates to a number of times the nozzle is passed over the surface.

Uniformity of the deposited ultra-thin films over the large area of the ITO substrate was investigated by optical microscopy. It was seen that irrespective of the materials and solvents being used, the deposited ultra-thin films show a uniform deposition without any coffee rings.

To determine the thickness of the different materials, tapping mode atomic force microscopy (AFM) was used. To measure the thickness, all materials were deposited on ITO-coated glass slides and the concentration of the solution was varied while keeping all other parameters constant. The desired ultra-low thickness of the material of interest was achieved by varying the solution concentration and the flow rate of the solution. PEDOT:PSS being diluted in water evaporated less during the flight from the nozzle to the micro-structured mesh 110 and hence the flow rate was less compared to IPA based materials (see Table 1). Also to evaporate the deposited liquid film 108 for PEDOT:PSS, the substrate temperature was kept at 60° C., which is also more than the substrate temperature used for IPA-based materials, which was 30° C. Excess of solution flow rate resulted in an edge effect, where more material was accumulated. Therefore, the flow rate was optimized according to the evaporative properties of the solvent being used.

As shown in Table 2, the minimum thickness achieved for PEDOT:PSS, PEIE and ZnO+PEIE is 14.51±0.627 nm, 5.95±0.199 nm, and 14.16±0.63 nm, respectively. The surface roughness (Ra) of the PEDOT:PSS, PEIE and ZnO+ PEIE composite thin films deposited on ITO substrate is found to be around 857.2 pm, 245.3 pm, and 2.6 nm respectively. This clearly shows that the method and apparatus enable achieving ultra-low thickness of thin films with very low surface roughness of the deposited thin film. The method and apparatus allow forming of such thin films using an up-scalable fabrication regime.

TABLE 2

Minimum thickness achieved for different materials over ITO substrate

|  | PEDOT:PSS | PEIE | ZnO + PEIE |
|---|---|---|---|
| Minimum thickness | 14.51 ± 0.627 nm | 5.95 ± 0.199 nm | 14.16 ± 0.63 nm |
| Surface roughness (Ra) | 857.2 pm | 245.3 pm | 2.6 nm |

To further investigate the effect of solution concentration on the thickness of the deposited thin films, a comprehensive investigation was done for all three materials with varying concentration. The results are shown in Table 3. The obtained results show that by varying the concentration of the solvent, the thickness of the deposited thin film could be varied.

TABLE 3

Thickness variation for different material for varying concentration

| Material | 0.01 ml PEIE/35 ml IPA | 0.025 ml PEIE/35 ml IPA | 0.05 ml PEIE/35 ml IPA | 0.07 ml PEIE/35 ml IPA | 0.1 ml PEIE/35 ml IPA |
|---|---|---|---|---|---|
| PEIE | 5.95 nm | 10.08 nm | 20.103 nm | 25.6 nm | 38.23 nm |
| Material | 1 ml Material/ 30 ml water | 1 ml Material/ 200 ml water | 1 ml Material/ 15 ml water | 1 ml Material/ 10 ml water | 1 ml Material/ 5 ml water |
| PEDOT:PSS | 14.51 nm | 22.67 nm | 31.9 nm | 38.22 nm | 48.9 nm |
| Material | 2 ml ZnO + 0.01 ml PEIE/30 ml IPA | 2 ml ZnO + 0.01 ml PEIE/20 ml IPA | 2 ml ZnO + 0.01 ml PEIE/15 ml IPA | 2 ml ZnO + 0.01 ml PEIE/10 ml IPA | 2 ml ZnO + 0.01 ml PEIE/5 ml IPA |
| ZnO + PEIE | 14.16 nm | 21.07 nm | 33.77 nm | 42.53 nm | 57.7 nm |

However, the previous results have been demonstrated on a substrate like ITO having high surface energy. The method and apparatus described above also provides versatility so that it may be used on substrate having low surface energy. Therefore, to investigate the flexibility of the method and apparatus, a low surface energy, temperature-sensitive super yellow light-emitting poly(1,4-phenylenevinylene) (PPV)

copolymer is used as a substrate. The surface energy of this substrate is measured using Fowke's theory, and it was found to be around 56 mN/m.

The materials and the deposition condition used in the previous studies on ITO is being duplicated on the super yellow (SY) substrates. Atomic force measurements were performed to measure the surface morphology of the deposited PEDOT:PSS, PEIE and ZnO+PEIE composite. The surface roughness of the deposited films was 766.9 pm, 798.3 pm and 2.102 nm respectively for PEDOT:PSS, PEIE and ZnO-PEIE composite, which is almost similar to the results obtained for the films deposited on the ITO substrate. SEM image obtained on the same set of samples also confirmed that there are no presence of coffee rings and the film is uniform throughout, even though the SY substrate was of low surface energy and a soft substrate. These extraordinary results confirm independence of the technology of the method and the apparatus to the nature of the substrate.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A method for applying thin film material onto a substrate, said method comprising:
    forming microdroplets of a solvent and a solute material forming the thin film material;
    depositing the microdroplets on an upper surface of a micro-structured mesh, wherein the microdroplets are deposited to allow coalescing of microdroplets on the micro-structured mesh into droplets extending at least into the micro-structured mesh and possibly protruding from a bottom surface of the micro-structured mesh; and
    arranging a surface of the substrate in close relation to, but not touching, the bottom surface of the micro-structured mesh such that a capillary force draws liquid of the droplets extending at least into the micro-structured mesh and possibly protruding from the bottom surface of the micro-structured mesh onto the surface of the substrate, whereby forced dynamic wetting of the surface of the substrate is provided to form a uniform liquid film on the surface of the substrate.

2. The method according to claim 1, further comprising, after the uniform liquid film has been formed on the surface of the substrate, separating the micro-structured mesh from the substrate.

3. The method according to claim 2, further comprising, after the uniform liquid film has been formed on the surface of the substrate, allowing the solvent to evaporate to leave the solute material on the surface of the substrate for forming a thin film on the substrate.

4. The method according to claim 3, wherein the thin film being formed on the substrate has a thickness smaller than 50 nm, such as smaller than 15 nm.

5. The method according to claim 3, further comprising controlling a concentration of the solute material in the microdroplets being formed such that a thickness of the thin film being formed on the substrate is controlled.

6. The method according to claim 1, wherein the microdroplets are deposited to allow coalescing of microdroplets on the micro-structured mesh into droplets protruding from the bottom surface of the micro-structured mesh and wherein arranging the surface of the substrate in close relation to the bottom surface of the micro-structured mesh comprises bringing the substrate in contact with the droplets protruding from the bottom surface of the micro-structured mesh.

7. The method according to claim 1, wherein the micro-structured mesh is formed by interlaced threads defining spacings between the threads.

8. The method according to claim 7, wherein a distance between adjacent threads is smaller than five times a diameter of the formed microdroplets.

9. The method according to claim 7, wherein the micro-structured mesh comprises a regular mesh pattern.

10. The method according to claim 1, wherein a diameter of the microdroplets is at least a factor 10 times smaller than a capillary length of the solvent.

11. The method according to claim 1, wherein arranging the surface of the substrate in close relation to the bottom surface of the micro-structured mesh comprises exerting a force on the micro-structured mesh for bringing the micro-structured mesh in close relation to the surface of the substrate.

12. The method according to claim 11, wherein the micro-structured mesh is flexible for bringing a portion of the micro-structured mesh in close relation to the surface of the substrate.

13. The method according to claim 1, wherein forming and depositing of microdroplets is made using ultrasonic spray coating.

* * * * *